United States Patent [19]

Roeder

[11] Patent Number: 4,513,429
[45] Date of Patent: Apr. 23, 1985

[54] SAMPLE DATA PHASE LOCKED LOOP FOR ADAPTIVE DOPPLER TRACKER

[75] Inventor: Allan W. Roeder, Whitesboro, N.Y.

[73] Assignee: The United States of America as represented by the Secretary of the Air Force, Washington, D.C.

[21] Appl. No.: 329,558

[22] Filed: Dec. 3, 1981

[51] Int. Cl.³ .................................... H03D 13/00
[52] U.S. Cl. ...................... 375/120; 343/7 PL; 375/77
[58] Field of Search ............. 375/81, 83, 94, 97, 375/120; 343/5 DP, 7 PL; 329/50, 136; 307/269, 511, 512

[56] References Cited

U.S. PATENT DOCUMENTS 3,986,123 10/1976 Tirro et al. ..................... 343/200
4,079,329 3/1978 England et al. ................. 329/50
4,243,941 1/1981 Zdunek ........................... 329/50

Primary Examiner—Robert L. Griffin
Assistant Examiner—Raymond C. Glenny
Attorney, Agent, or Firm—Donald J. Singer; Willard R. Matthews

[57] ABSTRACT

Precise phase acquisition and tracking of a data modulated pulse signal in order to recover the data in a low signal to noise ratio environment is achieved by a sample data phase locked loop that is adaptive, second order, and uses baseband polar coordinate processing. The circuit utilizes an adaptive second order loop where the loop bandwidth can be adjusted by a coherence measurement. This provides wide bandwidths during initial acquisition, medium bandwidths during acquisition/track transition and narrow bandwidth during tracking.

12 Claims, 5 Drawing Figures

SAMPLE DATA PHASE LOCKED LOOP FOR ADAPTIVE DOPPLER TRACKER

STATEMENT OF GOVERNMENT INTEREST

The invention described herein may be manufactured and used by or for the Government for governmental purposes without the payment of any royalty thereon.

BACKGROUND OF THE INVENTION

This invention generally relates to communications systems which require coherent detection of pulse or pulse compressed signals and in particular to a sample data phase locked loop that is adaptive, second order and uses baseband polar coordinate processing.

Communications systems such as the proposed USAF SEEK TALK system employ coherent doppler trackers for base line systems. The use of this type of circuit is particularly advantageous in that: (a) there is no doppler tracking loss during data detection even at highest doppler rates; (b) coherent detection is optimum which is particularly important since the modem must operate at low signal-to-noise ratios; (c) once a coherent reference is established it is relatively easy to generate a coherent signal for the array; and, (d) a frequency indication is provided which is useful for identifying the same signal in adjacent range bins.

Coherent doppler trackers can be implemented in either analog or digital form. Breakthroughs in analog/-digital converter technology, large scale integration of digital circuitry and the operational stability of digital processing makes digital implementation attractive. The sample data phase locked loop of the invention is an improvement to the digital implementation.

A standard technique for coherent data detection is the Costas receiver. This receiver uses a synchronous detector and a phase locked oscillator to provide a coherent reference for the received signal. This type of receiver, however, operates with rectangular coordinate X, Y pulse components and consequently requires complex signal processing. It does not measure coherence between an estimated phase and the input signal phase and it utilizes a constant bandwidth through all modes of operation. This results in some performance degradation.

The present invention on the other hand: (a) coherently tracks a repetitive complex pulse; (b) converts the X, Y pulse components to polar coordinate R, $\phi$ components to simplify signal processing; (c) provides a means for monitoring the coherence between an estimated phase and the input signal phase; (d) provides an adaptive second order loop where the loop bandwidth can be adjusted by the coherence measurement. This provides wide bandwidths during initial acquisition, medium bandwidths during acquision/track transition, and narrow bandwidths during tracking; and (e) implements the sample data phase lock loop with digital processing which can be time shared between multiple receivers and which allows a low cost implementation.

SUMMARY OF THE INVENTION

The invention is directed to a sample data phase locked loop for providing precise phase acquisition and tracking of a data modulated pulse signal in order to recover the data in a low signal-to-noise ratio environment. Rectangular coordinate in-phase and quadrature input signals are analog to digital (A/D) converted, and then converted from rectangular to polar coordinates. A phase estimate of the input signal is subtracted from the measured phase to obtain a phase error which is applied to phase estimate, frequency estimate, and coherence estimate loops, and to a data detection function. Bandwidth control from the coherence estimate loop is applied to the phase estimate and frequency estimate loops. Output from the frequency estimate loop is applied to the phase estimate loop whose output is applied to the data detection function. The bandwidth control provides for wide bandwidths during initial signal acquisition, medium bandwidth during acquisition track transition, and narrow bandwidth during tracking.

It is a principal object of the invention to provide a new and improved sample data phase locked loop circuit for an adaptive doppler tracker.

It is another object of the invention to provide a sample data phase locked loop circuit that converts the X, Y signal pulse components to polar coordinates to simplify signal processing.

It is another object of the invention to provide a sample data phase locked loop circuit implementing an adaptive second order loop whereby the loop bandwidth is automatically optimally adjusted in response to coherence measurements.

These together with other objects, features and advantages of the invention will become more readily apparent from the following detailed description when taken in conjunction with the illustrative embodiment in the accompanying drawings.

DETAILED DESCRIPTION OF THE PREFERRED EMBODIMENT

The invention comprises a sample data phase locked loop for an adaptive doppler tracker. Its object is to provide precise phase acquisition and tracking of a data modulated pulse signal in order to recover the data in a low signal-to-noise ratio environment. The technique is compatible with the outputs of baseband complex correlations which provide a bi-polar pulse in both an in-phase and quadrature component. The doppler frequency is carried by the time varying phase relationship between the rectangular coordinate input signals, X, Y where X is an in-phase signal and Y, a quadrature signal.

Figure 1:
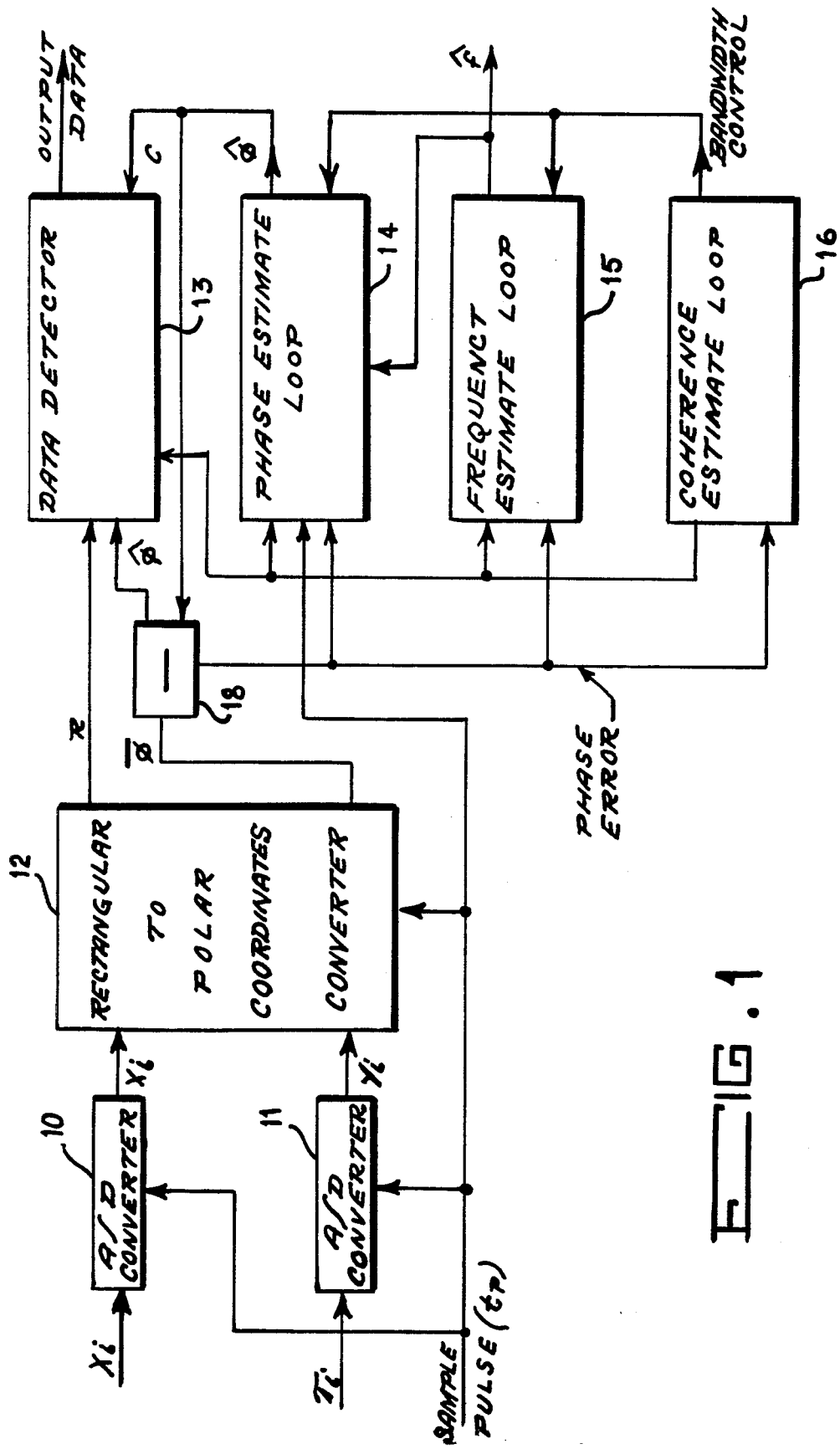
FIG. 1 is a functional block diagram of the sample data phase locked loop of the invention.

The invention uses analog/digital (A/D) converter means 10, 11 to digitize the X, Y inputs, a polar to rectangular coordinate converter 12, a phase estimate loop 14, a frequency estimate loop 15, a coherence estimate loop 16, adaptive gain controls, subtractor means 18, and a data detector 13. FIG. 1 shows the arrangement of these components. The bi-polar X, Y signals are converted to digital signals by the A/D converters 10, 11. The pulses are sampled into the A/D converters at time $t_p{}^*$. $t_p{}^*$ is a repetitive sample at the pulse repetition rate (signal data rate). Additional signals can be processed by the tracker by delaying $t_p{}^*$. The rectangular to polar coordinate translator 12 is also clocked by $t_p{}^*$. It translates digital rectangular coordinates X, Y to digital polar coordinate R, $\phi$. A phase estimate $\phi$ (expected phase of the input signal) is subtracted from the measured phase $\phi$ to provide a phase error $\phi_E$. The phase error $\phi_E$ is sent to the phase estimate loop 14, frequency estimate loop 15, coherence sensor loop 16 and the data detection function. The phase $\phi$ and frequency F loops provide the following functions:

$$\phi_{(i+1)} = \phi_{E(i)} \cdot K_1 + \phi_{(i)} + \hat{F}_{(i)} \quad (1)$$

$$\hat{F}_{(i+1)} = \phi_{E(i)} \cdot K_2 + \hat{F}_{(i)} \quad (2)$$

The subscript i identifies the particular pulse being processed. The frequency function $\hat{F}$ represents an estimated phase precession of magnitude varying directly with the signal frequency and with duration of the recursive interval $(1/t_p)$. $\hat{C}$ is the absolute value of the phase error $\phi_E$ averaged over a plurality of recursive intervals.

The coherence sensor provides the following function:

$$\hat{C}_{(i+1)} = \hat{C}_{(i)} - f(\phi_E) \quad (3)$$

The $K_1$, $K_2$ values are selected as a function of $\hat{C}$ as hereinafter explained. f ($\phi_E$) is a function of the phase error similar to a clipped cosine function.

The data detection output is:

$$D_o = R \cos \phi_E \quad (4)$$

Figure 2:
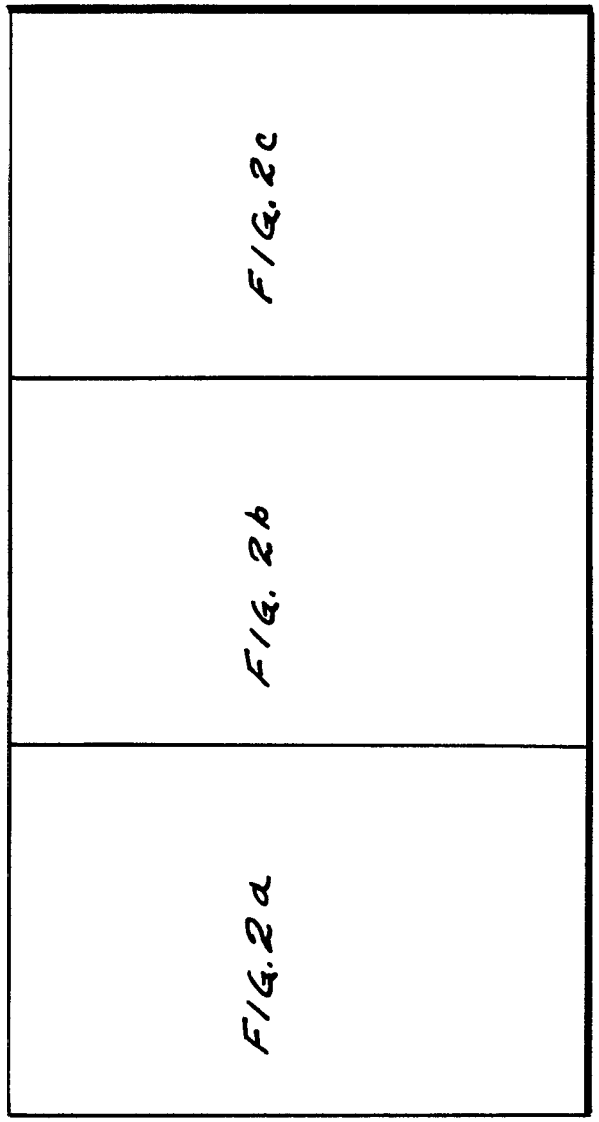
FIG. 2, comprised of FIGS. 2a, 2b and 2c is a schematic diagram of a baseline digital doppler tracker incorporating the sample data phase locked loop of the invention.
Figure 2A:
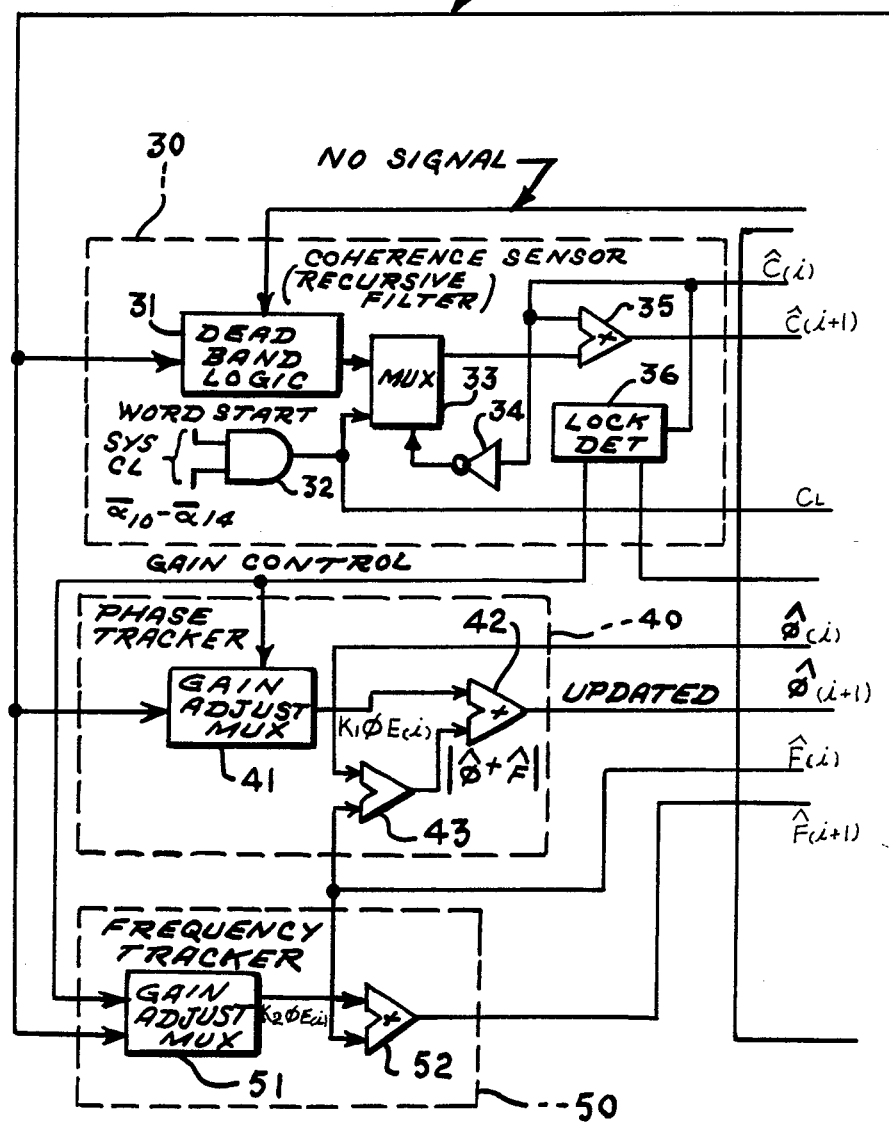
Figure 2B:
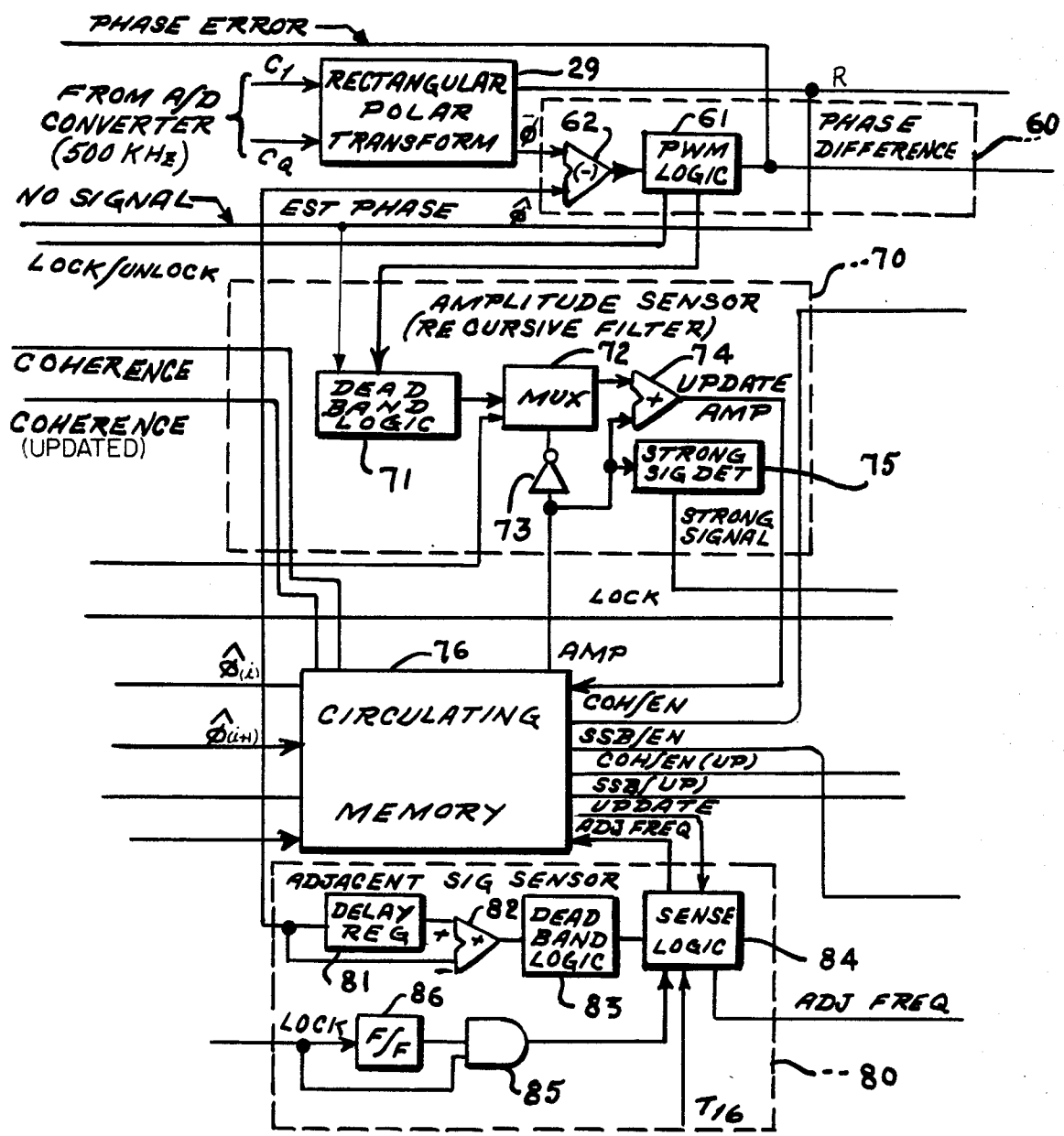
Figure 2C:
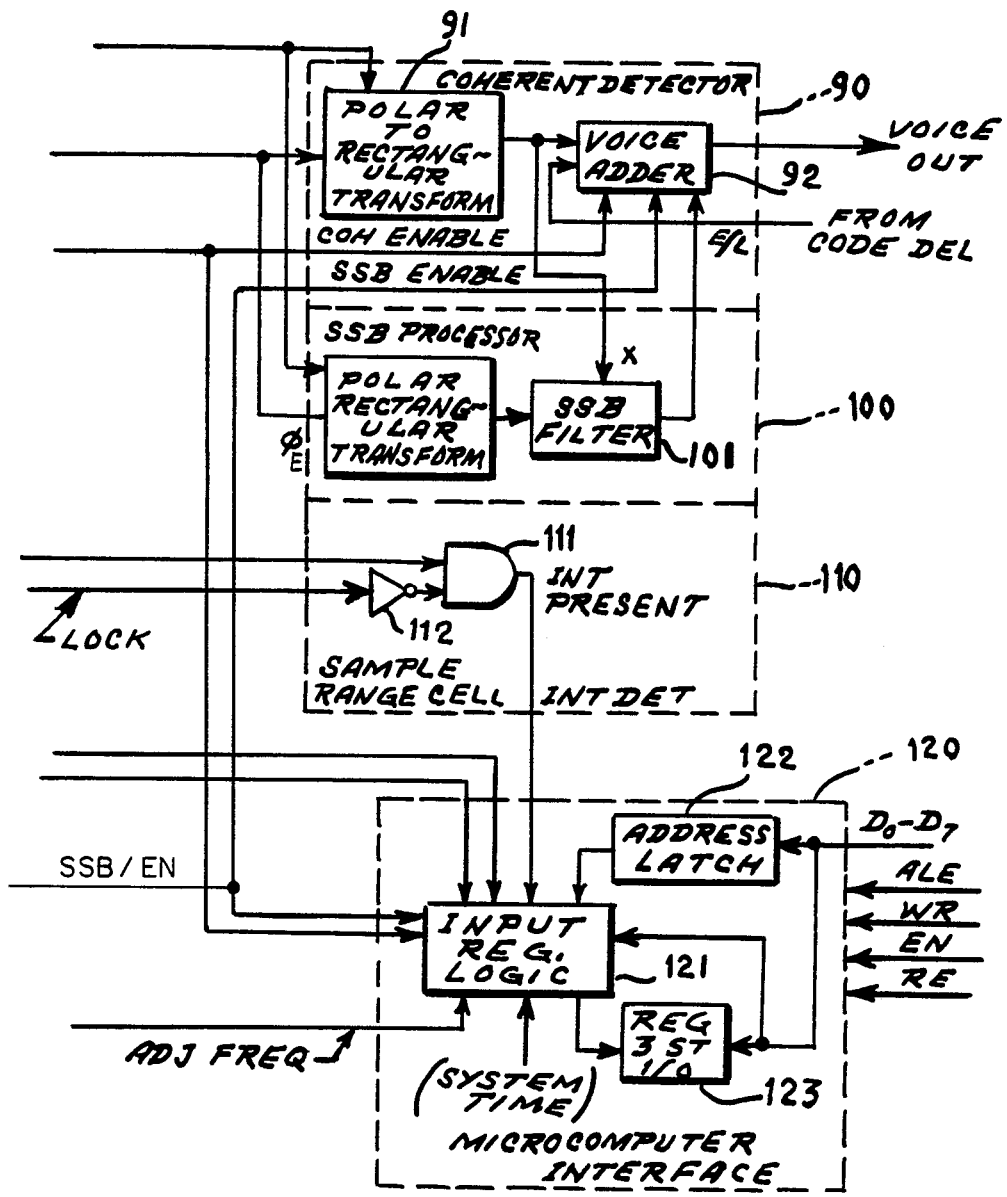

FIGS. 2a, 2b and 2c together constitute a first level diagram of an adaptive digital doppler tracker incorporating the sample data phase locked loop of the invention. Referring thereto the coordinate conversion function is provided by rectangular to polar transform means 29, which can be, for example, a 4096×12 ROM. The function of subtractor 18 (FIG. 1) is provided by phase difference circuit 60 which comprises differencing amplifier means 62 and logic circuit 61. The coherence estimate loop function is implemented by the coherence sensor (recursive filter) 30 and comprises dead band logic curcuit 31, AND gate 32, multiplexer 33, inverter 34, summing amplifier means 35 and lock detector circuit 36. Phase tracker 40, comprised of gain adjust multiplexer 41 and summing amplifier means 42, 43, provides the phase estimate loop function while the frequency estimate loop function is accomplished by frequency tracker 50 comprised of gain adjust multiplexer 51 and summing amplifier means 52. The data detection function is accomplished by coherent detector 90 comprised of polar to rectangular transform 91 and voice adder means 92. These circuits and functions are integrated into the adaptive digital doppler tracker of FIG. 2 as shown. The tracker also includes: adaptive sensor 70 comprised of dead band logic 71, multiplexer 72, inverter 73, summing amplifier means 74 and strong signal detector 75; circulating memory means 76; adjacent signal detector 80 comprised of delay regulator 81, summing amplifier means 82, deadband logic 83, sense logic 84, flip-flop 86 and AND gate 85; single sideband (SSB) processor 100 comprised of polar to rectangular transform 102 and SSB filter 101; same range cell detector 110 comprised of inverter 112 and AND gate 111; and microcomputer interface 120 comprised of input logic 121, address latch 122 and I/O regulator 123.

In operation, the sampled I and Q pulse inputs (correlator outputs) are converted from rectangular to polar coordinates in the 4096×12 bit ROM of rectangular to polar transform 29. A phase estimate, $\hat{\phi}$, is subtracted from the input $\phi$ to obtain a phase error $\phi_E$. The phase error is used in the phase locked loop and in the coherence sensors. The phase error is used to compute coherence, using the digital recursive filter 30 as shown in FIG. 2a. The coherence sensor 30 works as follows: A phase angle error of between $+30°$ and $-30°$ (actually 5/16 of 90°) is called a $+1$. A phase angle difference greater than $\pm 30°$ is called a $-1$. The recursive filter smooths the one bit output over approximately 100 data samples (approximately 6 milliseconds). The output will remain negative if there is no coherence between the phase estimate and the phase input. Only when there is a pronounced coherence will the smoothed output exceed zero. This condition is used to sense phase lock acquisition, transition, track and unlock. The number of bits in the digital recursive filter is minimized by subtracting 1/16 of the smoothed value (multiplying by 15/16) every sample. This approximates the algorithm $X_i = (1-K)yi + kyi$ with less hardware.

The values of $K_1$ and $K_2$ (equations 1 and 2) are varied according to measured coherence of the signal. For low coherence, the values of K are large so that the acquisition bandwidths are large. As coherence increases, the gains are reduced, thereby reducing the bandwidths. An amplitude sensor which is not a part of this invention is shown in FIG. 2b. The purpose of this sensor is to detect strong signals which track coherence. This is a situation that can occur when two independent pulse sequences ((X,Y) inputs) are time synchronous. The amplitude sensor and S.S.B. processors have been added to process and demodulate both signals in this case. Details of this function are given in the copending patent application of Alan Roeder entitled SIMULTANEOUS DETECTION OF TIME COINCIDENT SIGNALS IN AN ADAPTIVE DOPPLER TRACKER filed on even date herewith and incorporated herein by reference. The coherent detector 90 converts the polar coordinate $\phi_E$ to rectangular coordinates X. This is the in-phase component of a Costas phase lock loop, and contains the double-side band suppressed carrier (DSBSC) sampled data output. The microcomputer interface 120 allows status and command information, to be passed to and from a control microcomputer. Each of the signals that are tracked (up to 32 can be tracked simultaneously in the system shown in FIG. 2) requires 41 bits to describe the state.

| No. of Bits | State |
| --- | --- |
| 8 | Amplitude |
| 8 | Coherence |
| 12 | Phase |
| 10 | Frequency |
| 1 | Adjacent Frequency Source |
| 1 | Coherent Detector Enable |
| 1 | SSB Enable |

The memory 76 can be provided by shift registers of RAMS. Two high speed 256×4 RAMS, with some buffer registers, provide the required memory.

While the invention has been described in its preferred embodiment it is understood that the words which have been used are words of description rather than words of limitation and that changes within the purview of the appended claims may be made without departing from the scope and spirit of the invention in its broader aspects.

What is claimed is:

1. In a communications system a digital adaptive doppler tracker operating in response to system control signals, said adaptive doppler tracker including a sample data phase locked loop, said sample data phase locked loop comprising rectangular to polar coordinate conversion means receiving digitized bipolar X, Y inphase and quadrature input signals and outputting polar digital signals R, $\hat{\phi}$, subtractor means subtracting a phase estimate signal $\hat{\phi}$ from said phase signal $\phi$ to provide a phase error signal $\phi_E$, a coherence estimate loop receiving said phase error signal $\phi_E$ and providing the coherence function, $\hat{C}_{(i+1)} = \hat{C}_{(i)} - f(\phi_E)$, $f(\phi_E)$ being a function of phase error., said coherence estimate loop developing a bandwidth control output signal, a frequency estimate loop receiving said phase error signal $\phi_E$ and said bandwidth control signal and providing the frequency function, $\hat{F}_{(i+1)} = \phi_{E(i)} \cdot K_2 + \hat{F}_{(i)}$, a phase estimate loop receiving said phase error signal $\phi_E$ said bandwidth control signal and said frequency function $\hat{F}$ and providing the phase function $\hat{\phi}_{(i+1)} = \phi_{E(i)} \cdot K_1 + \hat{\phi}_{(i)} + \hat{F}_{(i)}$ the values of $K_1$ and $K_2$ being selected as a function of coherence function $\hat{C}$, and data detection means receiving polar digital signal R, phase estimate signal $\hat{\phi}$ and the phase function output of said phase estimate loop and providing an output $D_o = R \cos \phi_E$ therefrom.

2. A digital adaptive doppler tracker as defined in claim 1 including analog/digital converter means, said analog/digital converter means receiving analog signals from said communication system and outputting digitized bipolar X, Y in-phase and quadrature signals to said rectangular to polar coordinate conversion means.

3. A digital adaptive doppler tracker as defined in claim 2 including a circulating memory means operatively connected to said coherence estimate loop, said phase estimate loop, said frequency estimate loop and said communications system.

4. A digital adaptive doppler tracker as defined in claim 3 including a sample pulse source, said sample pulse source providing repetitive samples at times $t_p^*$ to said analog/digital converters, said rectangular to polar coordinates conversion means, and said phase estimate loop.

5. A digital adaptive doppler tracker as defined in claim 4 wherein said rectangular to polar coordinate conversion means comprises a read only memory.

6. A digital adaptive doppler tracker as defined in claim 5 wherein said subtractor means comprises a subtractor amplifier means receiving polar digital phase signal $\bar{\phi}$ said estimated phase signal $\hat{\phi}$ and outputting said phase error signal $\phi_E$, and a logic circuit, said logic circuit receiving said phase error signal $\phi_E$ from said subtractor amplifier means and a polar amplitude signal from said rectangular to polar coordinate conversion means, said logic circuit outputting said phase error signal $\phi_E$ to said coherence estimate loop, said frequency estimate loop and said phase estimate loop.

7. A digital adaptive doppler tracker as defined in claim 6 wherein said coherence estimate loop comprises a digital recursive filter.

8. A digital adaptive doppler tracker as defined in claim 7 wherein the values of K1 and K2 are varied in accordance with measured signal coherence.

9. A digital adaptive doppler tracker as defined in claim 8 wherein said coherence estimate loop comprises a dead band logic circuit receiving a polar amplitude signal from said rectangular to polar coordinates conversion means and a phase error signal $\phi_E$ from said subtractor means, an AND gate receiving system control signals, an inverter means receiving an output from said circulating memory means, multiplexer means receiving the outputs of said dead band logic circuit, said AND gate and said inverter means, a first summing amplifier means receiving outputs from said multiplexer means and said circulating memory means and feeding its output to said circulating memory means, and a lock detector circuit receiving an output of said circulating memory means and providing a gain control signal to said phase estimate loop and said frequency tracker loop.

10. A digital adaptive doppler tracker as defined in claim 9 wherein said phase estimate loop comprises a first gain adjust multiplexer receiving said gain control signal and said phase error signal $\phi_E$, a second summing amplifier receiving an input from said circulating memory means and an input from said frequency estimate loop, and a third summing amplifier receiving an input from said gain adjust multiplexer and an input from the output of said second summing amplifier and feeding its output to said circulating memory means.

11. A digital adaptive doppler tracker as defined in claim 10 wherein said frequency estimate loop comprises a second gain adjust multiplexer receiving said gain control signal and said phase error signal $\phi_E$, and a fourth summing amplifier receiving the output of said second gain adjust multiplexer and an output from said phase estimate loop and feeding its output to said circulating memory means.

12. A digital adaptive doppler tracker as defined in claim 11 wherein said data detection means comprises a polar to rectangular coordinate conversion means receiving the output of said subtractor means and a polar amplitude signal from said rectangular to polar coordinate conversion means, and a voice adder circuit receiving outputs from said polar to rectangular coordinate conversion means and said circulating memory means and outputting the signal $D_o = R \cos \phi_E$.

* * * * *